US012707771B2

(12) United States Patent
Herrmann

(10) Patent No.: US 12,707,771 B2
(45) Date of Patent: Aug. 11, 2026

(54) OPTOELECTRONIC SEMICONDUCTOR COMPONENT, OPTOELECTRONIC DEVICE, AND METHOD FOR PRODUCING AN OPTOELECTRONIC SEMICONDUCTOR COMPONENT AND/OR OPTOELECTRONIC DEVICE

(71) Applicant: ams-OSRAM International GmbH, Regensburg (DE)

(72) Inventor: Siegfried Herrmann, Neukirchen (DE)

(73) Assignee: ams-OSRAM International GmbH, Regensburg (DE)

( * ) Notice: Subject to any disclaimer, the term of this patent is extended or adjusted under 35 U.S.C. 154(b) by 414 days.

(21) Appl. No.: 18/272,074

(22) PCT Filed: Dec. 22, 2021

(86) PCT No.: PCT/EP2021/087257
§ 371 (c)(1),
(2) Date: Jul. 12, 2023

(87) PCT Pub. No.: WO2022/152533
PCT Pub. Date: Jul. 21, 2022

(65) Prior Publication Data
US 2024/0079531 A1 Mar. 7, 2024

(30) Foreign Application Priority Data
Jan. 13, 2021 (DE) ..................... 10 2021 100 546.9

(51) Int. Cl.
*H10H 20/85* (2025.01)
*H10H 20/841* (2025.01)
(Continued)

(52) U.S. Cl.
CPC ........ *H10H 20/8506* (2025.01); *H10H 20/85* (2025.01); *H10H 20/8508* (2025.01);
(Continued)

(58) Field of Classification Search
CPC .. H10H 20/036; H10H 20/0363; H10H 20/85; H10H 20/8506; H10H 20/855; H10H 20/856; H10H 20/857
See application file for complete search history.

(56) References Cited

U.S. PATENT DOCUMENTS

2009/0116209 A1* 5/2009 Engl .................. H10H 20/8506 361/818
2009/0289272 A1 11/2009 Kim et al.
(Continued)

FOREIGN PATENT DOCUMENTS

JP 2020205417 12/2020

OTHER PUBLICATIONS

International Search Report and Written Opinion issued in International Patent Application No. PCT/EP2021/087257 on Apr. 20, 2022.

*Primary Examiner* — Ratisha Mehta
*Assistant Examiner* — Adam Joseph Mott
(74) *Attorney, Agent, or Firm* — ArentFox Schiff LLP

(57) ABSTRACT

The invention relates to an optoelectronic semiconductor component, comprising a support which has a support element and a first and second contact structure, an optoelectronic semiconductor chip which is arranged on the support and is connected to the first and second contact structure in an electrically conductive manner, and a housing which is connected to the support in a form-fitting manner and has a cavity that is laterally delimited by a reflective housing wall of the housing and is arranged on the face of a first main surface of the support, wherein the wall thickness of the housing.

11 Claims, 6 Drawing Sheets

Figures 2A, 2B:
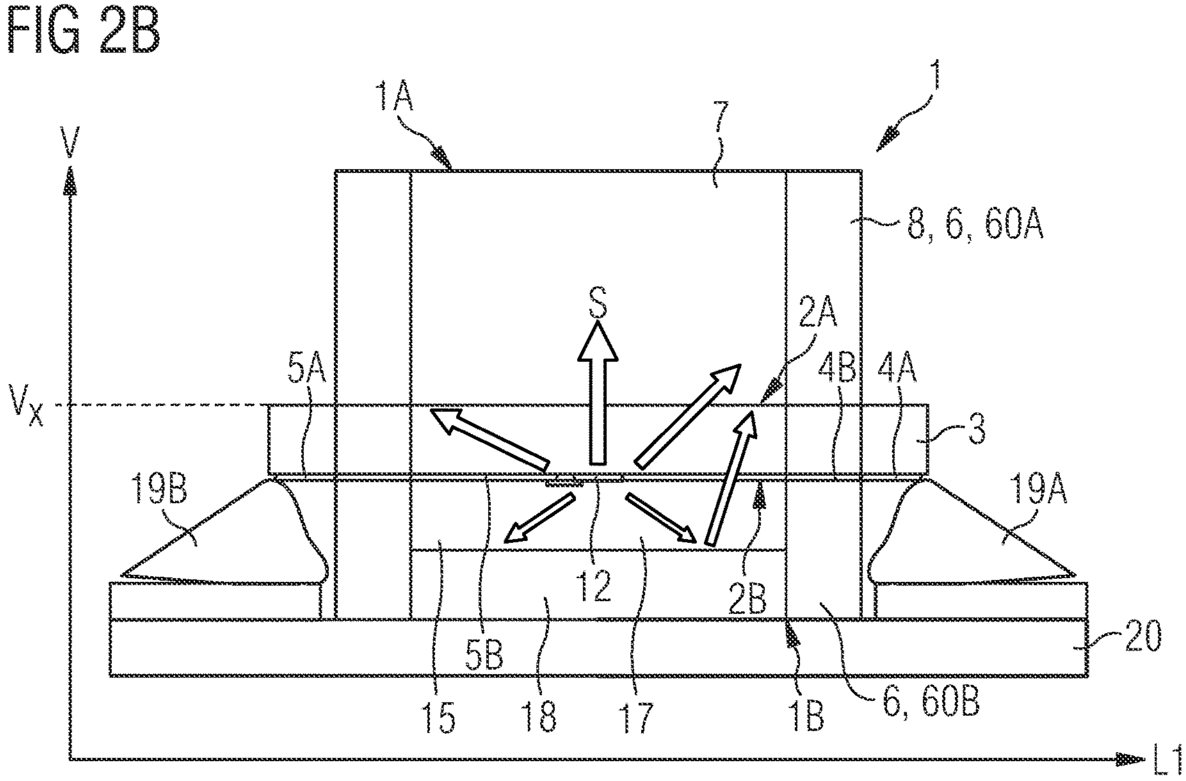

(51) Int. Cl.

| | |
|---|---|
| ***H10H 20/856*** | (2025.01) |
| ***H10H 20/857*** | (2025.01) |
| ***H10P 50/00*** | (2026.01) |
| ***H10W 72/00*** | (2026.01) |
| ***H10W 76/12*** | (2026.01) |
| ***H10W 90/00*** | (2026.01) |
| *H10H 20/01* | (2025.01) |
| *H10H 20/84* | (2025.01) |
| *H10H 20/851* | (2025.01) |
| *H10H 20/852* | (2025.01) |
| *H10P 14/60* | (2026.01) |
| *H10P 50/28* | (2026.01) |
| *H10P 58/00* | (2026.01) |
| *H10W 70/00* | (2026.01) |
| *H10W 70/05* | (2026.01) |
| *H10W 76/18* | (2026.01) |

(52) U.S. Cl.

CPC ........ *H10H 20/856* (2025.01); *H10H 20/857* (2025.01); *H10P 50/73* (2026.01); *H10W 76/167* (2026.01); *H10W 90/00* (2026.01); *H10H 20/036* (2025.01); *H10H 20/0363* (2025.01); *H10H 20/0364* (2025.01); *H10H 20/84* (2025.01); *H10H 20/841* (2025.01); *H10H 20/851* (2025.01); *H10H 20/852* (2025.01); *H10P 14/60* (2026.01); *H10P 14/6342* (2026.01); *H10P 50/28* (2026.01); *H10P 58/00* (2026.01); *H10W 70/096* (2026.01); *H10W 70/099* (2026.01); *H10W 72/801* (2026.01); *H10W 76/18* (2026.01); *H10W 90/701* (2026.01)

(56) References Cited

U.S. PATENT DOCUMENTS

| | | | | |
|---|---|---|---|---|
| 2019/0214375 | A1* | 7/2019 | Herrmann | H10H 20/841 |
| 2020/0105978 | A1* | 4/2020 | Sakamoto | H10H 20/856 |
| 2020/0118983 | A1* | 4/2020 | Pang | H10H 20/857 |
| 2020/0152822 | A1* | 5/2020 | Dirscherl | H01L 24/96 |
| 2023/0006108 | A1* | 1/2023 | Arndt | H10H 20/857 |
| 2023/0187588 | A1* | 6/2023 | Reith | H01L 24/20 257/98 |
| 2024/0014628 | A1* | 1/2024 | Pajkic | H01S 5/02315 |

* cited by examiner

FIG 1

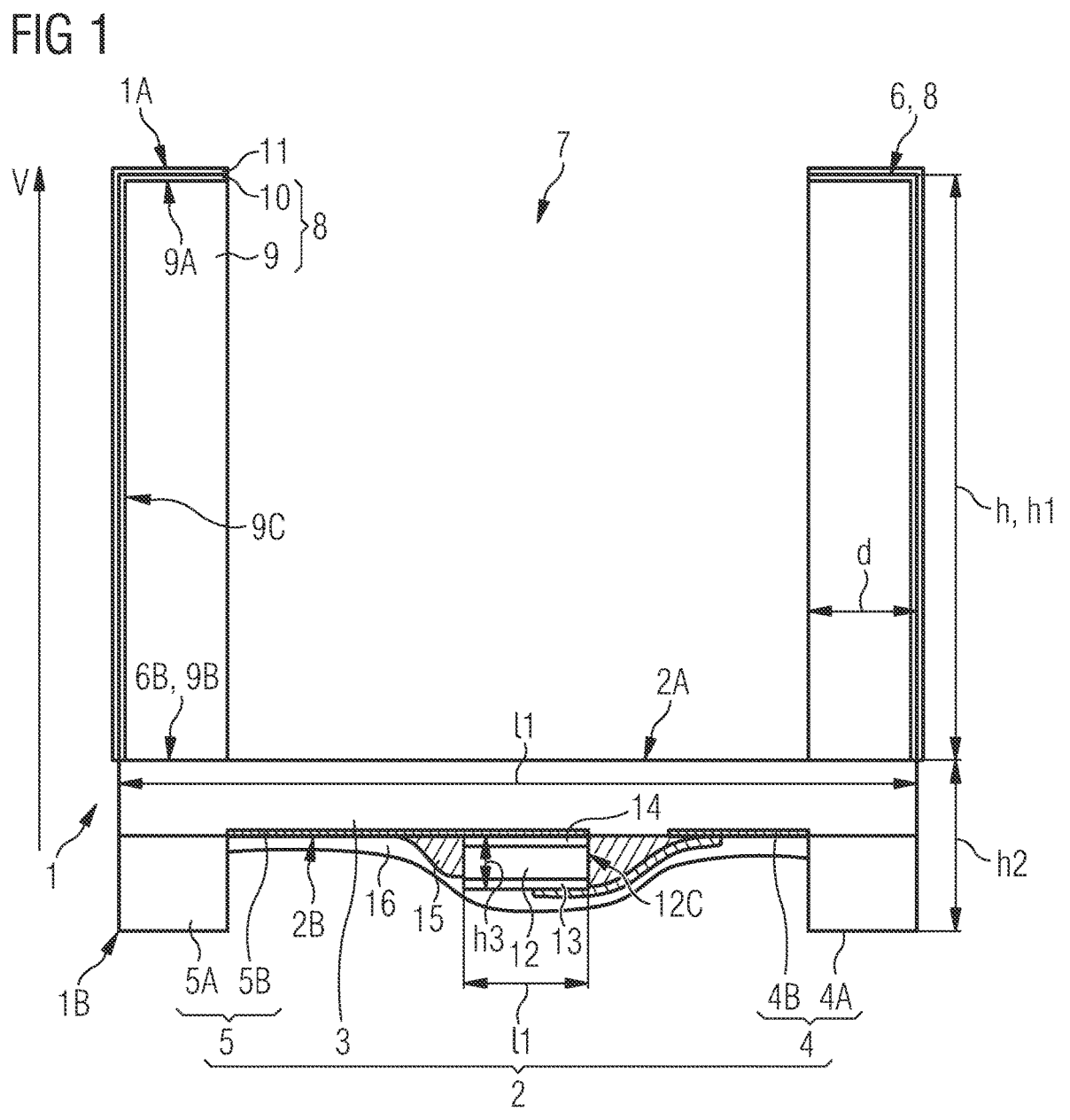

1A
11
10
8
9A
9
V
7
6, 8
9C
h, h1
d
6B, 9B
2A
l1
14
1
h2
2B
16
15
h3
12
13
12C
1B
5A 5B
5
3
l1
4B 4A
4
2 a1
8, 6, 60A
1
7
a2
V
2
4A
L2
5A
12
6, 60B
L1

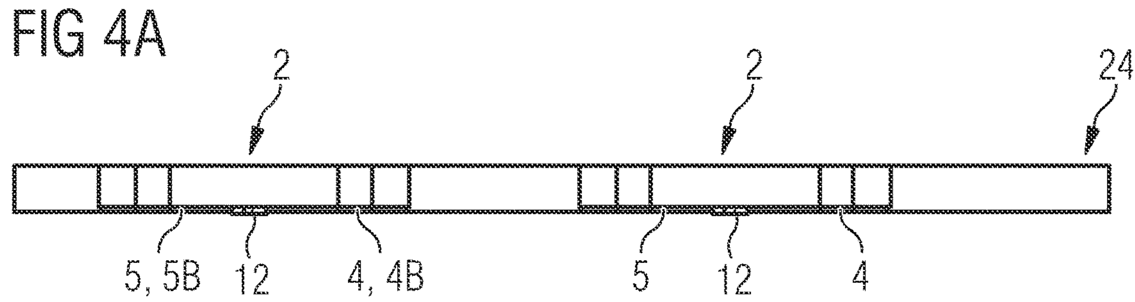
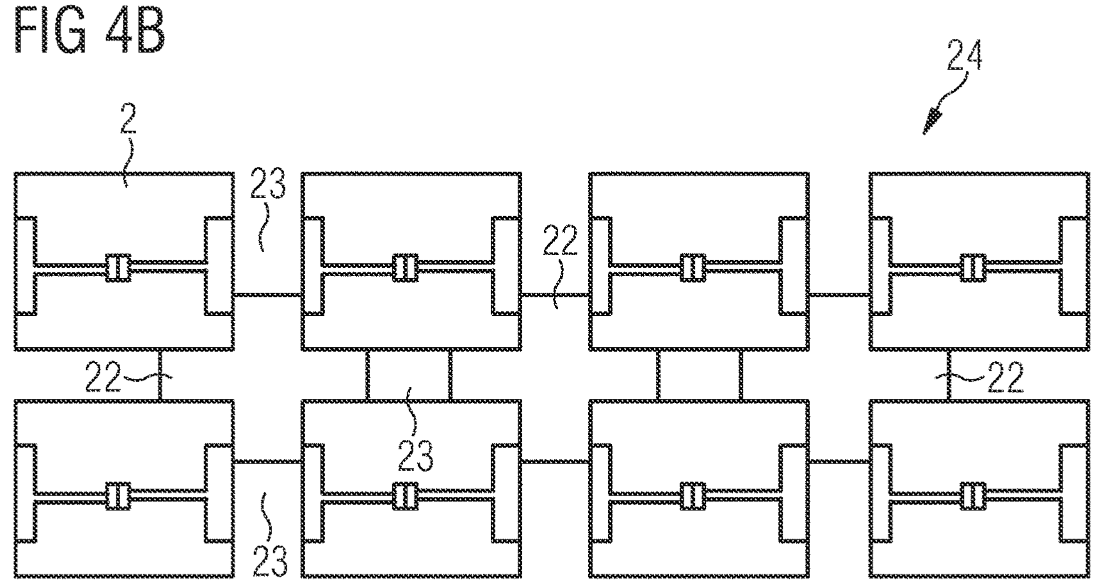
FIG 5
25
24
24A

OPTOELECTRONIC SEMICONDUCTOR COMPONENT, OPTOELECTRONIC DEVICE, AND METHOD FOR PRODUCING AN OPTOELECTRONIC SEMICONDUCTOR COMPONENT AND/OR OPTOELECTRONIC DEVICE

CROSS-REFERENCE TO RELATED APPLICATIONS

This application is a 35 U.S.C. § 371 National Phase of PCT Application No. PCT/EP2021/087257, filed Dec. 22, 2021, which claims priority to German Application No. 10 2021 100 546.9, filed Jan. 13, 2021, the disclosures of each of which are incorporated herein by reference in their entirety.

An optoelectronic semiconductor component, an optoelectronic device and a method for producing at least one optoelectronic semiconductor component and/or at least one optoelectronic device are specified. For example, the optoelectronic semiconductor component or the optoelectronic device is a microLED component or a microLED device, whose extents and luminous width lie in the micrometer range.

MicroLEDs are used, for example, in flat screens and form therein individual picture elements (pixels). It is known to produce microLED arrangements monolithically in a batch process, wherein a semiconductor layer sequence based on gallium nitride is formed epitaxially on a suitable substrate made of sapphire or silicon. The individual light-emitting diodes are not separated but retained as a display matrix. With the continuing miniaturization of applications such as indicator lights, however, there is a need for packaged microLEDs that can be installed as individual components in order to make the applications scalable in that way. Common LED components or packaged LED chips have so far had component sizes in the millimeter range.

An object to be achieved herein consists of specifying an optoelectronic semiconductor component with a reduced component size. Another object to be achieved consists in specifying an optoelectronic device with a reduced component size. Furthermore, an object to be achieved consists in specifying a method for producing an optoelectronic semiconductor component and/or an optoelectronic device with a reduced component part size.

These objects are achieved, among other things, by an optoelectronic semiconductor component, an optoelectronic device, and a method having the features of the independent claims.

In accordance with at least one embodiment of an optoelectronic semiconductor component, the latter comprises a carrier, which has a carrier element and a first and second contact structure. Furthermore, the optoelectronic semiconductor component comprises an optoelectronic semiconductor chip, which is arranged on the carrier and is electrically conductively connected to the first and second contact structures. It is possible for the optoelectronic semiconductor component to have at least two optoelectronic semiconductor chips which are each electrically conductively connected to the first and/or second contact structure. Moreover, the optoelectronic semiconductor component comprises a package which is form-fittingly connected to the carrier and has a cavity which is laterally delimited by a reflective package wall of the package and is arranged on the side of a first main surface of the carrier, wherein a wall thickness of the package wall lies in the single-digit or double-digit micrometer range.

The "form-fitting" connection is to be understood here to mean that the shape of the package adapts to the shape of the carrier at transitions to the carrier. The wall thickness denotes a maximum extent in a direction parallel to a surface normal of the reflective package wall.

Furthermore, the package can be integrally bonded to the carrier. The "integral" bond is to be understood here to mean that the package and the carrier are connected to one another by atomic or molecular bonds. This type of connection can be broken only by destroying the atomic or molecular bonds.

In accordance with at least one embodiment of the optoelectronic semiconductor component, the wall thickness of the package wall is at most 10 μm. Furthermore, a first outer diameter of the package wall which is defined along a first lateral direction can be 50 μm, for example. In addition, a second outer diameter which is defined along a second lateral direction can correspond to the first outer diameter and be 50 μm, for example. The second lateral direction can run perpendicular to the first lateral direction. Furthermore, a height of the package wall, which is determined along a vertical direction running perpendicular to the first and second lateral directions, can be 10 μm, for example.

In accordance with at least one embodiment of the optoelectronic semiconductor component, the package has a height in the single-digit or double-digit micrometer range. For example, the height of the package can be between 5 μm and 50 μm or between 10 μm and 20 μm.

The optoelectronic semiconductor component is preferably a radiation-emitting component that is provided for emitting electromagnetic radiation. In the present case, the term "electromagnetic radiation" is understood to mean, in particular, infrared, visible and/or ultraviolet electromagnetic radiation. During operation, at least some of the radiation is emitted on a front side of the optoelectronic semiconductor component. For example, the front side is arranged downstream of the first main surface of the carrier in the vertical direction. The optoelectronic semiconductor component is particularly preferably a microLED component. In this case, the semiconductor chip can have a first lateral extent, defined along the first lateral direction, which is, for example, between 5 μm and 20 μm, in particular approximately 10 μm. Furthermore, a second lateral extent, defined along the second lateral direction, can be the same size as the first lateral extent and can be, for example, between 5 μm and 20 μm, in particular approximately 10 μm. Furthermore, the height of the optoelectronic semiconductor chip can be 2 μm, for example.

In accordance with at least one embodiment of the optoelectronic semiconductor component, the optoelectronic semiconductor chip is arranged within the package wall in a top view of the optoelectronic semiconductor component. For example, the semiconductor chip is arranged at the center of the cavity in a top view of the optoelectronic semiconductor component.

In accordance with at least one embodiment of the optoelectronic semiconductor component, the optoelectronic semiconductor chip is arranged on a second main surface of the carrier lying opposite the first main surface. Alternatively, the optoelectronic semiconductor chip can be arranged on the first main surface of the carrier. In this case, the optoelectronic semiconductor chip can be arranged in the cavity of the package and surrounded laterally by the reflective package wall.

The carrier can be embedded in the package such that parts of the package are located on the first main surface and on the second main surface of the carrier. The carrier can be embedded at different vertical positions of the package.

Alternatively, the package can be arranged on the carrier and in this case be located, for example, on the first main surface of the carrier. In particular, the package consists here of the reflective package wall.

The reflective package wall makes it possible for a large portion of the radiation that is emitted by the semiconductor chip and is incident on the package wall to be reflected, so that at least some of the reflected radiation can be coupled out of the optoelectronic semiconductor component. The reflective package wall advantageously ensures that undesired volume radiation is avoided and Lambertian emission is made possible. Furthermore, the reflective package wall enables homogeneous color mixing when the radiation generated has different color components.

In accordance with at least one embodiment of the optoelectronic semiconductor component, the carrier has a planar shape. This means not only that its height is significantly lower compared to its lateral extents, but also that the carrier substantially does not have any curvatures, i.e. within the scope of typical production tolerances. The carrier can have a height of about μm.

The carrier or the carrier element can be radiation-transmissive, wherein the carrier or the carrier element is radiation-transmissive in particular with regard to the radiation generated by the semiconductor chip. This enables better radiation distribution in the package or in the cavity of the package. Suitable materials for the carrier element are, for example, glass or plastic. A ceramic material can also be used for the carrier element. The carrier element can be a film.

In accordance with at least one embodiment, the optoelectronic semiconductor chip comprises a semiconductor layer sequence having a first and second semiconductor region of different conductivity and an active zone arranged between the first and second semiconductor regions. Furthermore, the semiconductor chip can have a carrier substrate, which is a growth substrate, for example, and on which the semiconductor layer sequence is arranged or deposited epitaxially. The carrier substrate or growth substrate preferably comprises or consists of sapphire, SiC and/or GaN. A sapphire substrate is transparent to short-wavelength visible radiation, in particular in the blue to green range. The optoelectronic semiconductor chip is preferably a substrate-less semiconductor chip.

Materials preferably considered for the semiconductor layer sequence are those based on nitride compound semiconductors. "Based on nitride compound semiconductors" in the present context means that at least one layer of the semiconductor layer sequence comprises a nitride III/V compound semiconductor material, preferably $Al_nGa_mIn_{1-n-m}N$, wherein $0 \leq n \leq 1$, $0 \leq m \leq 1$, and $n+m \leq 1$. This material does not in this case necessarily have to have a mathematically exact composition in accordance with the above formula. Rather, it may comprise one or more dopants as well as additional constituents that do not substantially change the characteristic physical properties of the $Al_nGa_mIn_{1-n-m}N$ material. For the sake of simplicity, however, the above formula only includes the essential constituents of the crystal lattice (Al, Ga, In, N), even if they can to some extent be substituted by small amounts of further substances.

In particular, the semiconductor chip is a volume emitter, which emits the generated radiation substantially isotropically. For example, the semiconductor chip emits about 30% of the radiation generated at its side surfaces. The proportion radiated in the vertical direction depends on the type of contacting of the semiconductor chip.

In accordance with at least one embodiment, the optoelectronic semiconductor component has a conversion means with which it is possible to convert some of the radiation generated by the semiconductor chip into radiation of a different, for example longer, wavelength. For example, the conversion means can be quantum dots (QD). The conversion means is arranged in the cavity, for example.

Furthermore, the optoelectronic semiconductor component can have an optical element which is, for example, an element with a high refractive index. For example, the refractive index of the optical element is higher than the refractive index of air. The optical element can contain or consist of at least one of the following materials: glass, plastic. The optical element is provided, for example, to improve the output coupling of radiation or to shape the radiation emitted by the semiconductor chip in a desired manner. The optical element can be a glass fiber or a lens. For example, the optical element is arranged in the cavity.

In accordance with at least one embodiment of the optoelectronic semiconductor component, the package has a package body and a reflector layer, which is arranged on the package body. For example, the reflector layer is arranged on side surfaces of the package body which delimit the package body peripherally. Furthermore, the reflector layer can be arranged on a first main surface of the package body that is located on a side of the package body facing away from the carrier.

Plastics materials such as silicones, epoxides or epoxy resins can be used for the package body. In addition, the package body can be formed from spin-on glass (SOG). For example, the package body is a photostructured body. This means that the package body is produced by structuring a layer or layer sequence of a package body material using photolithography.

In accordance with at least one embodiment, the reflector layer contains or consists of a metal layer. The metal layer can be applied to the package body, for example by sputtering. At least one of the following materials is suitable for the metal layer: Au, Ag, Al, wherein the wavelength of the radiation emitted by the semiconductor chip is decisive for the choice of material. For example, for a semiconductor chip that emits blue light, a metal layer containing or consisting of Ag is suitable. A thickness of the reflector layer can lie between 10 nm and 50 nm.

Furthermore, the optoelectronic semiconductor component can have a passivation layer, which is arranged on the reflector layer. The passivation layer is provided, for example, for electrically insulating the reflector layer. The passivation layer can contain SiO2 or parylene, for example, or consist of one of these materials. The passivation layer can be an ALD (atomic layer deposition) layer, i.e. a layer produced by atomic layer deposition. In addition, the passivation layer can fulfill an optical function and, for example, increase the reflection at the package wall.

In accordance with at least one embodiment of the optoelectronic semiconductor component, the first contact structure has a first contact region arranged on a first side edge of the carrier, and the second contact structure has a second contact region arranged on a second side edge of the carrier, with the optoelectronic semiconductor component being electrically connectable from the outside by means of the first and second contact regions. For example, the optoelectronic semiconductor component is surface-mountable by means of the first and second contact regions. The first and second contact regions can each be rectangular. The second side edge may lie opposite the first side edge.

In an advantageous configuration of the optoelectronic semiconductor component, the carrier protrudes laterally beyond the package in such a way that the first and second contact regions are at least in part not covered by the package.

In accordance with at least one embodiment, the first contact structure has a first conductor track, which extends from the first contact region to the semiconductor chip and is electrically conductively connected to a first connection region of the semiconductor chip. The first connection region is electrically conductively connected to the first semiconductor region of the semiconductor chip. For example, the first semiconductor region is a p-conducting region, the first connection region is a p-side electrical connection of the semiconductor chip, and the first contact structure is a p-side electrical connection of the semiconductor component. Furthermore, the second contact structure can have a second conductor track, which extends from the second contact region to the semiconductor chip and is electrically conductively connected to a second connection region of the semiconductor chip. The second connection region is electrically conductively connected to the second semiconductor region of the semiconductor chip. The second semiconductor region can be an n-conducting region, the second connection region can be an n-side electrical connection of the semiconductor chip, and the second contact structure can be an n-side electrical connection of the semiconductor component. For example, the first and/or second conductor track serve(s) as mounting regions for the optoelectronic semiconductor chip.

The first and second contact structures are each formed from an electrically conductive material, for example from a metal or a metal compound or a transparent conductive oxide (TCO).

In accordance with at least one embodiment, the package is arranged on the carrier, and the optoelectronic semiconductor chip and the first and second contact structures are arranged on a side of the carrier element facing away from the package. In particular, the package consists here of the reflective package wall.

Alternatively, the carrier can be embedded in the package such that parts of the package are located on a first main surface and on a second main surface of the carrier.

According to at least one embodiment, the package has at least one anchoring element, which is arranged in a cutout of the carrier. In particular, the anchoring element is formed in one piece with the package. The anchoring element ensures a more stable mechanical connection between the package and the carrier.

In accordance with at least one embodiment of an optoelectronic device, the latter comprises at least two optoelectronic semiconductor components of the type mentioned above, wherein the packages of two adjoining optoelectronic semiconductor components are formed in one piece. For example, the optoelectronic device comprises three optoelectronic semiconductor components whose semiconductor chips emit radiation of different wavelengths, for example red, green and blue light. The optoelectronic device can therefore be an RGB unit.

The method described below is suitable for producing an optoelectronic semiconductor component or a plurality of optoelectronic semiconductor components or for producing an optoelectronic device or a plurality of optoelectronic devices of the type mentioned above. Features described in connection with the semiconductor component or the device can therefore also be used for the method and vice versa.

In accordance with at least one embodiment of a method for producing at least one optoelectronic semiconductor component and/or at least one optoelectronic device of the type mentioned above, this comprises the following steps:

providing a starting carrier, which has a carrier or an assembly of a plurality of carriers, arranging at least one optoelectronic semiconductor chip on a respective carrier and electrically conductively connecting to the first and second contact structures of the carrier, producing one or more packages by:

forming at least a part of a package body or in each case at least a part of a plurality of package bodies from at least one layer of a package body material, wherein the at least one layer is applied in a form-fitting manner to a first main surface of the starting carrier and in each case formed with a cavity for an optoelectronic semiconductor component or in each case a plurality of cavities for an optoelectronic device, and producing a reflector layer on the package body or bodies so that the cavity or cavities is/are delimited laterally by a reflective package wall, the wall thickness(es) of which lie(s) in the single-digit or double-digit micrometer range.

The method steps are preferably carried out in the order given. This means in particular that the package is produced after the semiconductor chip has been mounted on the carrier.

For example, the optoelectronic semiconductor chip can be arranged on the carrier by means of transfer printing.

According to at least one embodiment, at least one further layer of a package body material is applied in a form-fitting manner to a second main surface of the starting carrier during the production of the package body or package bodies. The at least one further layer of the package body material can be provided with a reflector layer on its side facing away from the starting carrier.

The carriers can be arranged in rows in the starting carrier.

The starting carrier can be formed to be continuous, that is to say substantially without interruptions. Alternatively, the starting carrier may have interruptions, wherein for example the carriers are spaced apart by gaps in the starting carrier. In particular, the carriers of each row are spaced apart from one another by gaps in this case. Furthermore, two adjacent rows of carriers can be connected to one another in each case by a row of separating structures, wherein the separating structures of each row are likewise spaced apart from one another by gaps. When the carrier assembly is singulated, the separating structures are at least partially severed. This embodiment of a starting carrier is particularly suitable for the production of an optoelectronic device.

Furthermore, the carriers can each have a cutout, which is provided for receiving an anchoring element of the package.

In accordance with at least one embodiment, the optoelectronic semiconductor chip is attached to a first conductor track of the first contact structure and/or to a second conductor track of the second contact structure. Furthermore, the first conductor track can be electrically conductively connected to a first connection region and the second conductor track can be electrically conductively connected to a second connection region of the semiconductor chip.

According to at least one embodiment, the package body material is spun onto the first main surface of the starting carrier during the production of the package body or a plurality of package bodies. Spin-on glass (SOG), for example, is suitable as the package body material here.

The cavity or cavities in the at least one layer of the package body material can be produced using photolithography. In this case, a photostructurable mask layer, for example a photoresist layer, can be applied to the at least one layer of the package body material, exposed and developed. The at least one layer of the package body material can be structured with the aid of the mask layer, for example by means of dry etching. The mask layer can then be removed.

In accordance with at least one embodiment, the reflector layer is applied in each case to side surfaces of the package body, which delimit the package body peripherally. Furthermore, the reflector layer can in each case be arranged on a first main surface of the package body that is located on a side of the package body facing away from the carrier. For example, the reflector layer, for example if it consists of a metal layer, is sputtered onto the package body. In order to prevent the reflector layer in each case from covering inner surfaces of the package body that delimit the cavity, the cavity can be filled, for example, with a photostructurable filling material, for example a photoresist, which is removed after the reflector layer has been produced.

The optoelectronic semiconductor component or the optoelectronic device is particularly suitable for backlighting units or indicator lights, such as status indicators.

Further advantages, advantageous embodiments and developments arise from the exemplary embodiments described below in conjunction with the figures.

Figure 3:
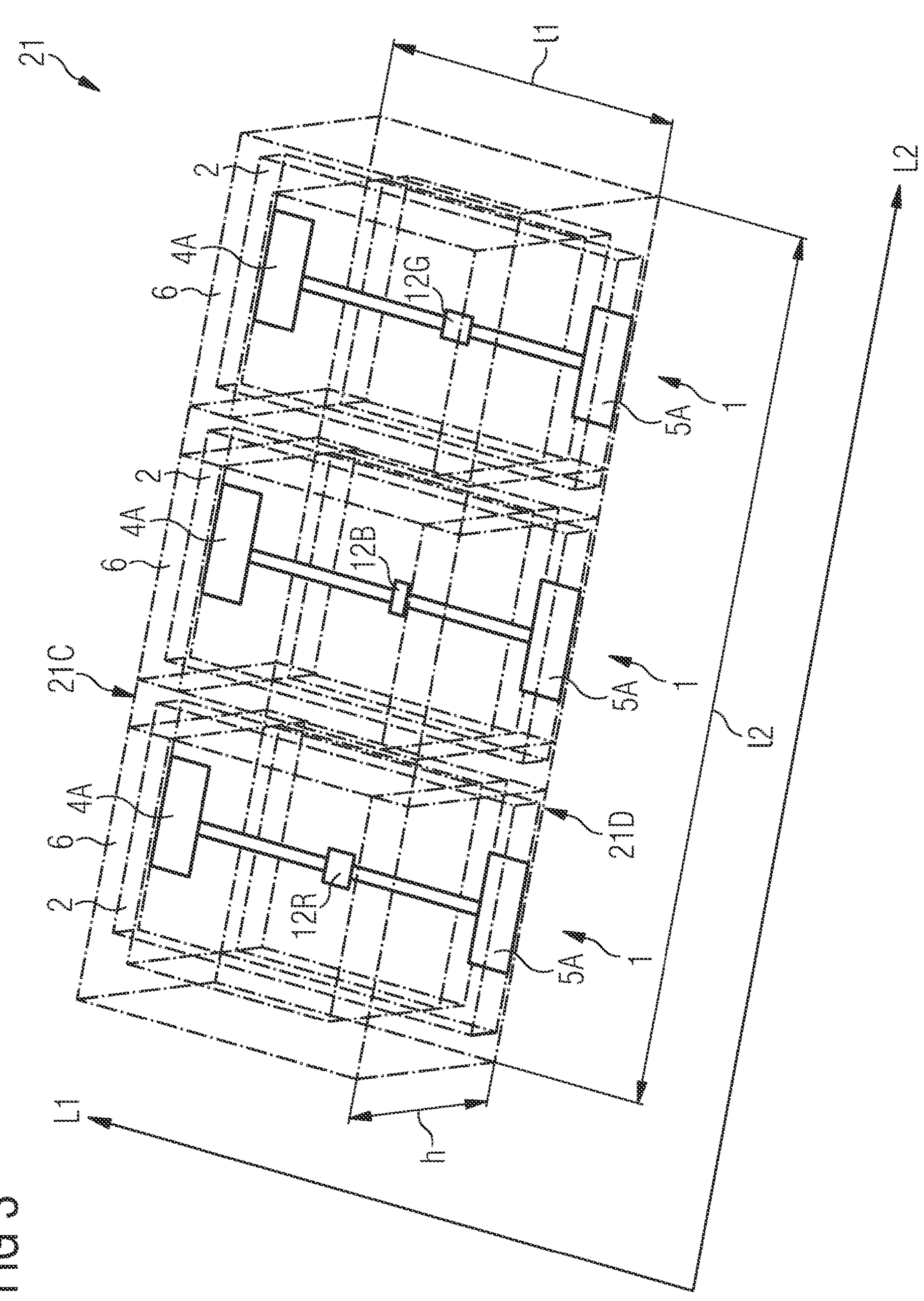
Figure 6:
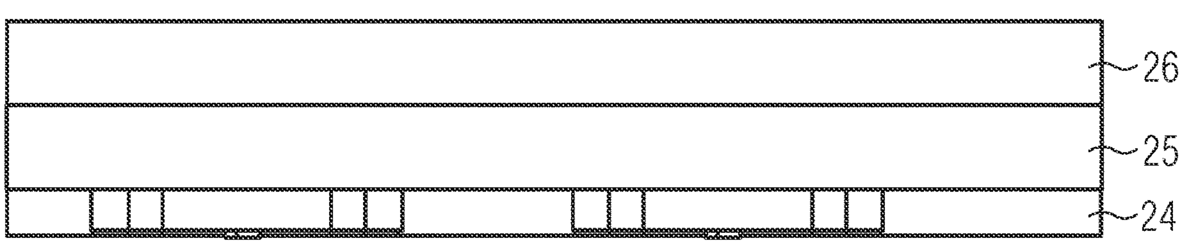
Figure 7A:
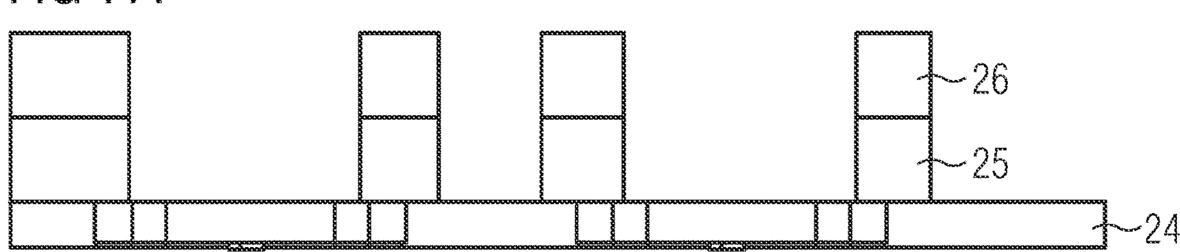
Figure 7B:
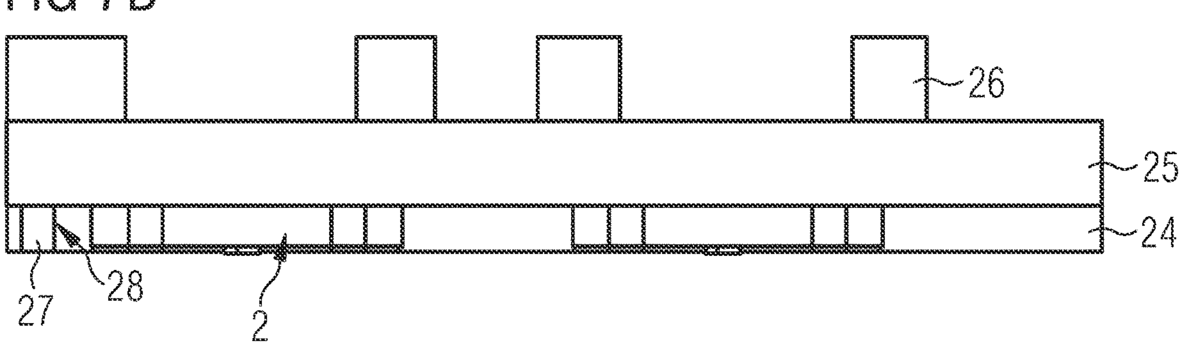
Figure 8:
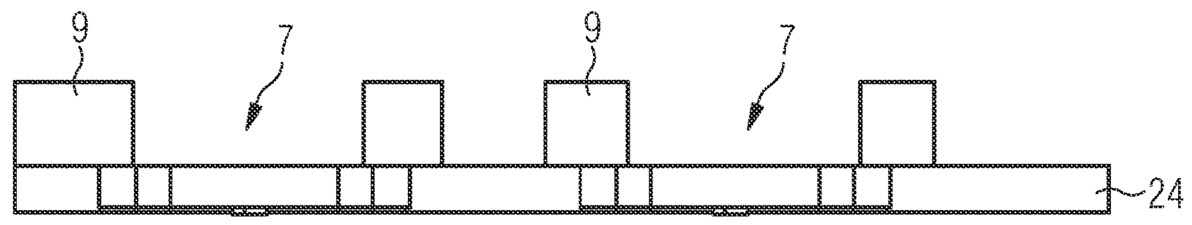
Figure 9:
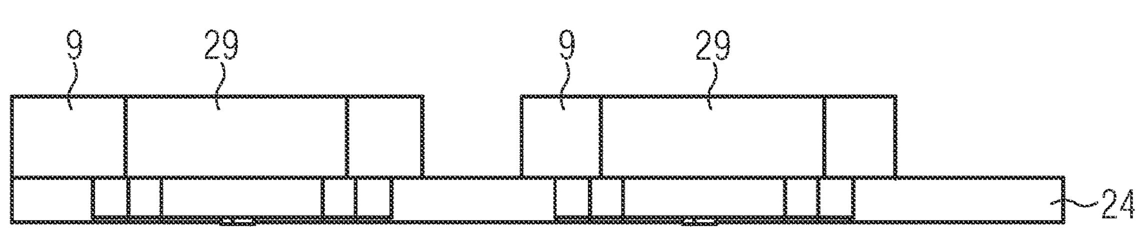
Figure 10:
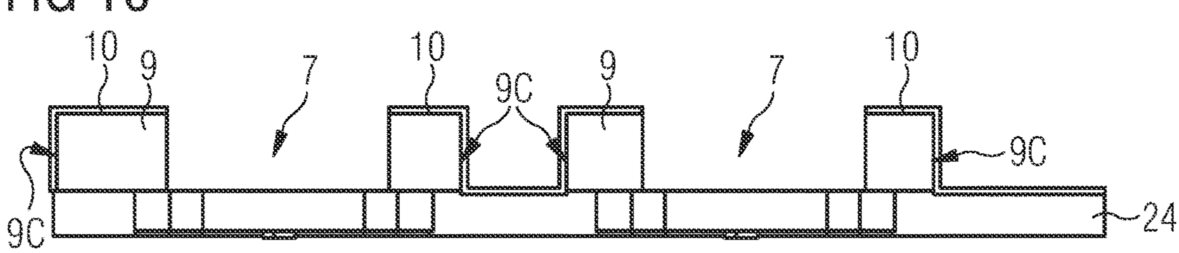
Figure 11:
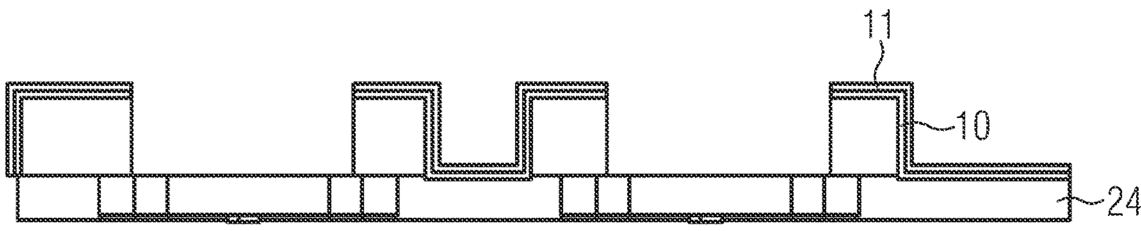

In the figures:

FIG. 1 shows a schematic cross-sectional view of a first exemplary embodiment of an optoelectronic semiconductor component, FIG. 2A shows a schematic perspective view of a second exemplary embodiment of an optoelectronic semiconductor component, and FIG. 2B shows a schematic cross-sectional view of an exemplary embodiment of an arrangement made up of the optoelectronic semiconductor component according to the second exemplary embodiment and a connection carrier, FIG. 3 shows a schematic perspective view of an exemplary embodiment of an optoelectronic device, FIGS. 4 to 11 show schematic illustrations of method steps of a method according to a first exemplary embodiment, with FIGS. 4B, 7B and 11 showing possible variants, FIGS. 4 to 12 show schematic illustrations of method steps of a method according to a second exemplary embodiment, with FIGS. 4B, 7B and 11 showing possible variants.

In the exemplary embodiments and figures, elements that are the same, are of the same type, or act in the same way can be provided in each case with the same reference signs. The elements shown and their proportions relative to one another should not necessarily be considered to be true to scale; rather, individual elements can be shown in an exaggerated size for better illustration and/or to provide a better understanding.

A first exemplary embodiment of an optoelectronic semiconductor component 1 is illustrated in FIG. 1. The optoelectronic semiconductor component 1 is a radiation-emitting component that is provided for emitting electromagnetic radiation. In the present case, the term "electromagnetic radiation" is understood to mean, in particular, infrared, visible and/or ultraviolet electromagnetic radiation. During operation, at least some of the radiation S, in particular a large portion of the radiation S, is emitted on a front side 1A of the optoelectronic semiconductor component 1 (cf. FIG. 2B).

The optoelectronic semiconductor component 1 comprises a carrier 2 arranged on a rear side 1B of the semiconductor component 1 lying opposite the front side 1A. The carrier 2 has a carrier element 3 and a first contact structure 4 and a second contact structure 5. Furthermore, the optoelectronic semiconductor component 1 comprises an optoelectronic semiconductor chip 12, which is arranged on the carrier 2 and is electrically conductively connected to the first and second contact structures 4, 5.

Furthermore, the optoelectronic semiconductor component 1 comprises a package 6 with a cavity 7, which is laterally delimited, i.e. in lateral directions L1, L2 (cf. FIG. 2A), by a reflective package wall 8 of the package 6 and arranged on the side of a first main surface 2A of the carrier 2.

In the first exemplary embodiment, the package 6 consists of the reflective package wall 8. The package 6 or the reflective package wall 8 has a package body 9 and a reflector layer 10, which is arranged on the package body 9. The reflector layer 10 is arranged on side surfaces 9C of the package body 9 which delimit the package body 9 peripherally. Furthermore, the reflector layer 10 is arranged on a first main surface 9A of the package body 9 that is located on a side of the package body 9 facing away from the carrier 2.

Plastics materials such as silicones, epoxides or epoxy resins can be used for the package body 9. Moreover, the package body 9 can be formed from spin-on glass (SOG). For example, the package body 9 is a photo-structured body. This means that the package body 9 is produced by structuring a layer or layer sequence of a package body material using photolithography. In this case, the package 6 or the package body 9 is integrally bonded to the carrier 2. The "integral" bond is to be understood to mean that the package 6 or the package body 9 and the carrier 2 are connected to one another by atomic or molecular bonds.

The reflector layer 10 can contain or consist of a metal layer. A thickness of the reflector layer 10 can lie between 10 nm and 50 nm. At least one of the following materials is suitable for the metal layer: Au, Ag, Al, wherein the wavelength of the radiation S emitted by the semiconductor chip 12 is decisive for the choice of material (cf. FIG. 2B). For example, for a semiconductor chip 12 that emits blue light, a metal layer containing or consisting of Ag is suitable.

A passivation layer 11 is arranged on the package wall 8 or on the reflector layer 10 and is provided, for example, for electrically insulating the reflector layer 10. In addition, the passivation layer 11 can fulfill an optical function and, for example, increase the reflection at the package wall 8. The passivation layer 11 can contain SiO2 or parylene, for example, or consist of one of these materials. The passivation layer 11 can be an ALD (atomic layer deposition) layer, i.e. a layer produced by atomic layer deposition.

The package 6 is connected to the carrier 2 in a form-fitting manner. The "form-fitting" connection is to be understood here to mean that the shape of the package 6 adapts to the shape of the carrier 2 at transitions to the carrier 2. In the first exemplary embodiment, the transitions are between a second main surface 6B, 9B of the package 6 or package body 9 and the first main surface 2A of the carrier 2.

The reflective package wall 8 makes it possible for a large portion of the radiation that is emitted by the semiconductor chip 12 and is incident on the package wall 8 to be reflected, so that at least some of the reflected radiation can be coupled out of the optoelectronic semiconductor component 1 on the front side 1A. The reflective package wall 8 advantageously ensures that undesired volume radiation is avoided and Lambertian emission is made possible. Furthermore, the reflective package wall 8 enables homogeneous color mixing when the radiation generated has different color components.

The optoelectronic semiconductor component 1 can have a conversion means (not shown) with which it is possible to convert some of the radiation generated by the semiconductor chip into radiation of a different, for example longer, wavelength. For example, the conversion means can be quantum dots (QD). The conversion means is arranged in the cavity 7, for example.

In a top view of the front side 1A of the optoelectronic semiconductor component 1, the optoelectronic semiconductor chip 12 is arranged inside the package wall 8, preferably in the middle. The optoelectronic semiconductor chip 12 is arranged on a second main surface 2B of the carrier 2 which is located on a side of the carrier 2 facing away from the reflective package wall 8.

The optoelectronic semiconductor chip 12 can have a semiconductor layer sequence with a first and second semiconductor region of different conductivity and an active zone (not illustrated) arranged between the first and second semiconductor regions. For example, the optoelectronic semiconductor chip 12 is a substrate-less semiconductor chip in which a growth substrate, on which the semiconductor layer sequence was grown, is detached or at least thinned.

Materials based on nitride compound semiconductors are preferably suitable for the semiconductor layer sequence of the semiconductor chip 12. "Based on nitride compound semiconductors" in the present context means that at least one layer of the semiconductor layer sequence comprises a nitride III/V compound semiconductor material, preferably $Al_nGa_mIn_{1-n-m}N$, wherein $0 \leq n \leq 1$, $0 \leq m \leq 1$, and $n+m \leq 1$. This material does not in this case necessarily have to have a mathematically exact composition in accordance with the above formula. Rather, it may comprise one or more dopants as well as additional constituents that do not substantially change the characteristic physical properties of the $Al_nGa_mIn_{1-n-m}N$ material. For the sake of simplicity, however, the above formula only includes the essential constituents of the crystal lattice (Al, Ga, In, N), even if they can to some extent be substituted by small amounts of further substances.

The semiconductor chip 12 has a first connection region 13, which is electrically conductively connected to the first semiconductor region of the semiconductor chip 12. Furthermore, the semiconductor chip 12 has a second connection region 14, which is electrically conductively connected to the second semiconductor region of the semiconductor chip 12. For example, the first semiconductor region is a p-conducting region, and the first connection region 13 is a p-side electrical connection of the semiconductor chip 12. Furthermore, the second semiconductor region is, for example, an n-conducting region, and the second connection region 14 is an n-side electrical connection of the semiconductor chip 12.

In particular, the semiconductor chip 12 is a volume emitter, which emits the generated radiation S substantially isotropically (cf. FIG. 2B). For example, the semiconductor chip 12 emits about 30% of the radiation generated at its side surfaces 12C.

The first contact structure 4 has a first contact region 4A and a first conductor track 4B, which extends from the first contact region 4A to the semiconductor chip 12 and is electrically conductively connected to the first connection region 13 of the semiconductor chip 12. Furthermore, the second contact structure 5 has a second contact region 5A and a second conductor track 5B, which extends from the second contact region 5A to the semiconductor chip 12 and is electrically conductively connected to the second connection region 14 of the semiconductor chip 12.

In this case, the second conductor track 5B serves as a mounting region for the optoelectronic semiconductor chip 12.

The first contact region 4A is arranged at a first side edge of the carrier 2, and the second contact region 5A is arranged at a second side edge of the carrier 2. The first and second contact regions 4A, 5A can each be rectangular. The semiconductor component 1 is electrically connectable from the outside by means of the first and second contact regions 4A, 5A. Furthermore, the optoelectronic semiconductor component 1 is surface-mountable by means of the first and second contact regions 4A, 5A.

The semiconductor chip 12 can be covered on the side surfaces 12C by an encapsulation 15, which is formed in particular from an electrically insulating material. Furthermore, the semiconductor component 1 can have an insulation layer 16, for example made of a dielectric material, which largely electrically insulates the semiconductor component 1 on the rear side 1B. The insulation layer 16 is arranged on the second main surface 2B of the carrier 2 and covers the semiconductor chip 12 and the conductor tracks 4B, 5B. In particular, only the contact regions 4A, 5A are free from the insulation layer 16. For example, the insulation layer is suitable for reflecting at least some of the radiation so that it enters the cavity 7. The insulation layer 16 can contain SiO2 or parylene, for example, or consist of one of these materials.

The optoelectronic semiconductor component 1 is a microLED component. A wall thickness d of the package wall 8 lies in the single-digit or double-digit micrometer range. For example, the wall thickness d of the reflective package wall 8 is at most 10 μm. The wall thickness d denotes a maximum extent in a direction parallel to a surface normal of the reflective package wall 8.

Furthermore, a first outer diameter a1 of the package wall 8, defined along the first lateral direction L1, is 50 μm, for example. In addition, a second outer diameter a2 defined along the second lateral direction L2 can correspond to the first outer diameter a1 and be 50 μm (cf. FIG. 2A), for example.

Furthermore, a height h1 of the package wall 8 or a height h of the package 6, which is determined along a vertical direction V running perpendicular to the first and second lateral directions L1, L2, is 10 μm, for example.

The semiconductor chip 12 has a first lateral extent 11, which is between 5 μm and 20 μm, for example, and in particular approximately 10 μm. Furthermore, a second lateral extent 12 (not shown) can be the same size as the first lateral extent 11 and can be, for example, between 5 μm and 20 μm, in particular approximately 10 μm. Furthermore, the height h3 of the optoelectronic semiconductor chip 12 can be 2 μm, for example.

The carrier 2 has a planar shape. This means not only that its height h2 is significantly lower compared to its lateral extents 11, 12 (12 is not shown), but also that the carrier 2 substantially does not have any curvatures, i.e. within the scope of typical production tolerances. The carrier 2 can have a height h2 of about 30 μm.

The carrier element 3 is radiation-transmissive in particular with regard to the radiation generated by the semiconductor chip 12. This enables better radiation distribution in the package 6 or in the cavity 7 of the package 6. Suitable materials for the carrier element 3 are, for example, glass or plastic. The carrier element 3 can be a film.

Furthermore, in particular the conductor tracks 4B, 5B of the contact structures 4, 5 can be formed from a radiation-transmissive material, such as TCO. By contrast, for example, metals or metal compounds which are distinguished by both their electrical conductivity and by a comparatively high reflectivity for the radiation emitted by the semiconductor chip 12 are suitable for the contact regions 4A, 5A.

Due to its comparatively small component size, the optoelectronic semiconductor component 1 is particularly suitable for microLED applications.

A second exemplary embodiment of an optoelectronic semiconductor component 1 is described in conjunction with FIGS. 2A and 2B. In the following text, mainly the differences from the first exemplary embodiment will be discussed.

The carrier 2 is embedded in the package 6 such that a first part 60A of the package 6 is located on the first main surface 2A and a second part 60B of the package 6 is located on the second main surface 2B of the carrier 2. For example, the first part 60A of the package 6 forms the reflective package wall 8.

The semiconductor chip 12 is arranged in the second part 60B of the package 6. For example, the semiconductor chip 12 is arranged in a cavity 17 of the second part 60B of the package 6 and embedded here in an encapsulation 15, which is likewise arranged in the cavity 17. The encapsulation 15 can be formed separately or can belong to the second part 60B of the package 6. Furthermore, a reflector layer 18 can be arranged on the rear side 1B of the semiconductor component 1, which reflects at least some of the incident radiation to the front side 1A. The reflector layer 18 can contain or consist of a metal layer. Alternatively, a Bragg mirror, i.e. a sequence of dielectric layers with alternating refractive index, can be used as the reflector layer 18.

The carrier 2 can be embedded at different vertical positions $V_x$ of the package 6.

Furthermore, the carrier 2 projects beyond the package 6 laterally parallel to the first lateral direction L1, so that the first and second contact regions 4A, 5A are at least in part not covered by the package 6.

As can be seen from FIG. 2B, the optoelectronic semiconductor component 1 can be electrically conductively connected to a connection carrier 20 in the first contact region 4A by a first connection means 19A and in the second contact region 5A by a second connection means 19B. The first and second connection means 19A, 19B can be solder balls.

FIG. 3 shows an exemplary embodiment of an optoelectronic device 21.

The optoelectronic device 21 comprises three optoelectronic semiconductor components 1 according to any of the exemplary embodiments described above, which are arranged next to one another along the second lateral direction L2. The packages 6 of two adjoining optoelectronic semiconductor components 1 are formed in one piece. The carriers 2 are arranged such that the first contact regions 4A of the semiconductor components 1 are located on a first side 21C of the optoelectronic device 21 and the second contact regions 5A are located on a second side 21D opposite the first side 21C. This arrangement makes it possible for each semiconductor component 1 to be electrically contacted independently of the others.

In each package 6 an optoelectronic semiconductor chip 12B, 12G, 12R is arranged, wherein the semiconductor chips 12B, 12G, 12R emit radiation of different wavelengths. For example, the semiconductor chip 12B emits blue light, the semiconductor chip 12G emits green light, and the semiconductor chip 12R emits red light. The optoelectronic device 21 can therefore be an RGB unit.

The optoelectronic device 21 has a first lateral extent 11, which is approximately 50 μm, for example. Furthermore, the optoelectronic device 21 has a second lateral extent 12, which is approximately 100 μm, for example. Finally, the height h of the optoelectronic device 21 can be approximately 10 μm.

Due to its comparatively small component size, the optoelectronic device 21 is also suitable for microLED applications.

Various exemplary embodiments of a method for producing optoelectronic semiconductor components and/or optoelectronic devices of the type mentioned above are described in connection with FIGS. 4 to 12.

FIG. 4A illustrates the method step of providing

- a starting carrier 24, which has an assembly of a plurality of carriers 2 arranged in a row, wherein an optoelectronic semiconductor chip 12 is arranged on a carrier 2 and is electrically conductively connected to the first and second contact structure 4, 5 of the carrier 2. In particular, the optoelectronic semiconductor chip 12 is attached on a first conductor track 4B of the first contact structure 4 and/or on a second conductor track 5B of the second contact structure 5, wherein the semiconductor chips 12 are arranged on the carriers by means of transfer printing, for example. Furthermore, the first conductor track 4B can be electrically conductively connected to a first connection region 13 and the second conductor track 5B to a second connection region 14 of the semiconductor chip 12 (cf. FIG. 1). The starting carrier 24 can be formed to be continuous, that is to say substantially without interruptions between the carriers 2.

Alternatively, as illustrated in FIG. 4B, the starting carrier 24 may have interruptions, wherein the carriers 2 are spaced apart from one another by gaps 23. In particular, the carriers 2 of each row are spaced apart from one another by gaps 23. Furthermore, two adjacent rows of carriers 2 are connected to one another by a row of separating structures 22, wherein the separating structures 22 of each row are likewise spaced apart from one another by gaps 23. When the carrier assembly is singulated, the separating structures 22 are at least partially severed. This embodiment of a starting carrier 24 is particularly suitable for the production of an optoelectronic device 21 (cf. FIG. 3).

In order to produce package bodies 9, in a further step, which is shown in FIG. 5, a layer 25 of a package body material is applied to a first main surface 24A of the starting carrier 24 in a form-fitting manner. For example, the package body material is spun onto the first main surface 24A. Spin-on glass (SOG), for example, is suitable as the package body material here.

To produce cavities 7, the layer 25 is structured in further steps. For example, the layer 25 is structured photolithographically. In this case, a photostructurable mask layer 26, for example a photoresist layer, can be applied to the layer 25, exposed and developed (cf. FIGS. 6, 7B). The layer can be structured with the aid of the mask layer 26 (cf. FIG. 7A). For example, the structuring takes place by means of dry etching. The mask layer 26 is then removed (cf. FIG. 8).

As can be seen from FIG. 7B, at least part of the carrier 2 can have a cutout 28, in which an anchoring element 27 engages. In particular, the anchoring element 27 is formed in one piece with the associated package body 9 or package.

The anchoring element 27 ensures a more stable mechanical connection between the package and the carrier 2.

To produce a reflector layer 10 on the package bodies 9, the cavities 7 can first be filled with a filling material 29, for example, that is photostructurable, for example a photoresist, which is removed after the production of the reflector layer 10 or after the production of a passivation layer 11 (cf. FIGS. 9 to 11). As a result, it is possible to prevent a covering of inner surfaces of the package body 9, which delimit the respective cavity 7, by the reflector layer 10 or passivation layer 11. The reflector layer 10 is applied to the side surfaces 9C of the package bodies 9. Furthermore, the reflector layer 10 is applied to the first main surfaces 9A of the package bodies 9. For example, the reflector layer 10, for example if it consists of a metal layer, is sputtered onto the package bodies 9.

The passivation layer 11 is applied to the reflector layer 10 by means of ALD (atomic layer deposition) (cf. FIG. 11), for example. The passivation layer 11 can contain SiO2 or parylene, for example, or consist of one of these materials.

For the production of an optoelectronic semiconductor component or an optoelectronic device, wherein the carrier 2 is embedded in the package 6 as, for example, in the second exemplary embodiment, such that a first part 60A of the package 6 is located on the first main surface 2A and a second part 60B of the package 6 is located on the second main surface 2B of the carrier 2, the method described in connection with FIGS. 4 to 11 can be continued.

Figure 12:
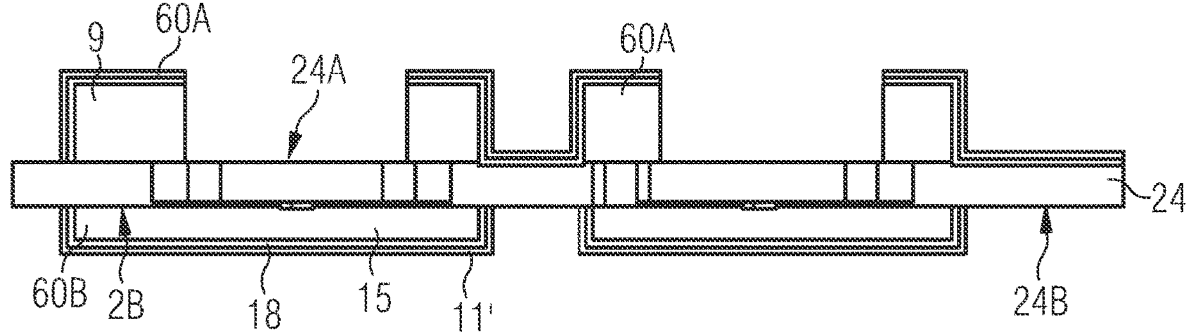

As shown in FIG. 12, the steps described in connection with FIGS. 5 to 11 can be carried out in a similar manner on a second main surface 24B of the starting carrier 24, which means, for example, that a further layer of a package material can be applied to the second main surface 24B, which is provided for the formation of a second part of the package bodies 9 and, moreover, of the encapsulations 15. Furthermore, a further reflector layer 18 and moreover a further passivation layer 11' can be applied to the second part of the package bodies 9.

The invention is not restricted to the exemplary embodiments by the description on the basis thereof. Rather, the invention encompasses any novel feature and any combination of features, which includes in particular any combination of features in the claims, even if this feature or this combination itself is not explicitly specified in the claims or exemplary embodiments.

LIST OF REFERENCE SIGNS

1 Optoelectronic semiconductor component
1A Front side
1B Rear side
2 Carrier
2A First main surface
2B Second main surface
3 Carrier element
4 First contact structure
4A First contact region
4B First conductor track
Second contact structure
5A Second contact region
5B Second conductor track
6 Package
6B Second main surface
7, 17 Cavity
8 Reflective package wall
9 Package body
9A First main surface
9B Second main surface
9C Side surface
10, 18 Reflector layer
11, 11' Passivation layer
12, 12B, 12G, 12R Optoelectronic semiconductor chip
12C Side surface
13 First connection region
14 Second connection region
15 Encapsulation
16 Insulation layer
19A First connection means
19B Second connection means
Connection carrier
21 Optoelectronic device
21C First side
21D Second side
22 Separation structure
23 Gap
24 Starting carrier
24A First main surface
24B Second main surface
25 Layer of package body material
26 Mask layer
27 Anchoring element
28 Cutout
29 Filling material
a1 First outer diameter
a2 Second outer diameter
11 First lateral extent
12 Second lateral extent
d Wall thickness
h, h1, h2, h3 Height
$v_x$ Vertical position
L1 First lateral direction
L2 Second lateral direction
S Radiation
V Vertical direction

The invention claimed is:

1. An optoelectronic semiconductor component, comprising:

a carrier having a carrier element and first and second contact structures, an optoelectronic semiconductor chip, which is arranged on the carrier and is electrically conductively connected to the first and second contact structures, a package which is form-fittingly connected to the carrier and has a cavity which is laterally delimited by a reflective package wall of the package and is arranged on a side of a first main surface of the carrier, wherein a wall thickness of the reflective package wall lies in a single-digit or double-digit micrometer range, wherein:

the package is arranged on the carrier, and the optoelectronic semiconductor chip and the first and second contact structures are arranged on a side of the carrier element facing away from the package, or the carrier is embedded in the package such that parts of the package are located on the first main surface and on a second main surface of the carrier.

2. The optoelectronic semiconductor component as claimed in claim 1, wherein the wall thickness is at most 10 μm.

3. The optoelectronic semiconductor component as claimed in claim 1, wherein the package has a height in the single-digit or double-digit micrometer range.

4. The optoelectronic semiconductor component as claimed in claim 1, wherein the optoelectronic semiconductor chip is arranged on the optoelectronic semiconductor component within the reflective package wall in a top view.

5. The optoelectronic semiconductor component as claimed in claim 1, wherein the package has a package body and a reflector layer, which is arranged on the package body.

6. The optoelectronic semiconductor component as claimed in claim 5, wherein the package body is a photo-structured body.

7. The optoelectronic semiconductor component as claimed in claim 5, wherein the reflector layer contains a metal layer.

8. The optoelectronic semiconductor component as claimed in claim 1, wherein:

the first contact structure has a first contact region arranged on a first side edge of the carrier, and the second contact structure has a second contact region arranged on a second side edge of the carrier, and wherein the optoelectronic semiconductor component is electrically connectable from the outside by the first and second contact regions.

9. The optoelectronic semiconductor component as claimed in claim 1, wherein the carrier projects beyond the package laterally in such a way that the first and second contact regions are not covered by the package.

10. The optoelectronic semiconductor component as claimed in claim 1, wherein the package has at least one anchoring element, which is arranged in a cutout of the carrier.

11. An optoelectronic device having at least two optoelectronic semiconductor components as claimed in claim 1, wherein respective packages of two adjoining optoelectronic semiconductor components are formed in one piece.

* * * * *